United States Patent
Yen et al.

(10) Patent No.: US 11,190,164 B2
(45) Date of Patent: Nov. 30, 2021

(54) USING ACOUSTIC REFLECTOR TO REDUCE SPURIOUS MODES

(71) Applicant: Texas Instruments Incorporated, Dallas, TX (US)

(72) Inventors: Ting-Ta Yen, San Jose, CA (US); Jeronimo Segovia Fernandez, San Jose, CA (US); Bichoy Bahr, Allen, TX (US); Peter Smeys, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 369 days.

(21) Appl. No.: 16/422,494

(22) Filed: May 24, 2019

(65) Prior Publication Data
US 2020/0373908 A1     Nov. 26, 2020

(51) Int. Cl.
| | | |
|---|---|---|
| *H03H 9/17* | (2006.01) | |
| *H03H 9/13* | (2006.01) | |
| *H03H 9/05* | (2006.01) | |
| *H03H 9/10* | (2006.01) | |
| *H03H 9/15* | (2006.01) | |

(52) U.S. Cl.
CPC ......... *H03H 9/175* (2013.01); *H03H 9/0533* (2013.01); *H03H 9/0547* (2013.01); *H03H 9/1007* (2013.01); *H03H 9/132* (2013.01); *H03H 2009/155* (2013.01)

(58) Field of Classification Search
CPC ...... H03H 9/175; H03H 9/132; H03H 9/0547; H03H 9/1007; H03H 9/0533; H03H 9/173; H03H 9/02118; H03H 2009/155
See application file for complete search history.

(56) References Cited

U.S. PATENT DOCUMENTS

| | | |
|---|---|---|
| 5,373,268 A | 12/1994 | Dworsky et al. |
| 6,087,198 A | 7/2000 | Panasik |
| 6,548,942 B1 | 4/2003 | Panasik |
| 9,129,886 B2 | 9/2015 | Jacobsen et al. |
| 9,503,047 B2 | 11/2016 | Jacobsen et al. |
| 9,524,881 B2 | 12/2016 | Jiang et al. |
| 9,660,603 B2 | 5/2017 | Jiang et al. |

(Continued)

OTHER PUBLICATIONS

Remco Strijbos et al, "Design and Characterisation of High-Q Solidly-Mounted Bulk Acoustic Wave Filters", 2007 Proceedings 57th Electronic Components and Technology Conference, May 29-Jun. 1, 2007, Reno, Nevada, pp. 169-174.

(Continued)

*Primary Examiner* — Jeffrey M Shin
(74) *Attorney, Agent, or Firm* — Michael A. Davis, Jr.; Charles A. Brill; Frank D. Cimino

(57) ABSTRACT

A micromechanical system (MEMS) resonator includes a base substrate. A piezoelectric layer has a first electrode attached to a first surface of the piezoelectric layer and a second electrode attached to a second surface of the piezoelectric layer opposite the first electrode. The first electrode is bounded by a perimeter edge. A patterned acoustic mirror is formed on a top surface of the first electrode opposite the piezoelectric layer, such that the patterned acoustic mirror covers a border strip of the top surface of the first electrode at the perimeter edge and does not cover an active portion of the top surface of the first electrode.

20 Claims, 11 Drawing Sheets

(56) References Cited

U.S. PATENT DOCUMENTS

| | | |
|---|---|---|
| 9,896,330 B2 | 2/2018 | Wachtler et al. |
| 9,929,714 B2 | 3/2018 | Jacobsen et al. |
| 10,135,415 B2 | 11/2018 | Soman et al. |
| 2009/0267457 A1* | 10/2009 | Barber .................. H03H 3/02 310/334 |
| 2011/0249889 A1 | 10/2011 | Kothandaraman et al. |
| 2017/0026029 A1 | 1/2017 | Bahai et al. |
| 2017/0330841 A1 | 11/2017 | Cook et al. |
| 2018/0246323 A1 | 8/2018 | Fedigan et al. |
| 2019/0007020 A1 | 1/2019 | Yen |
| 2019/0007023 A1 | 1/2019 | Yen |
| 2019/0052247 A1 | 2/2019 | Yen |

OTHER PUBLICATIONS

Fing-Ta Yen et al, "Bulk Acoustic Wave Resonator on a Stress Isolated Platform", TI-78499, U.S. Appl. No. 15/857,906, filed Dec. 29, 2017, pp. 1-22.

Arun Paidmarri et all, "A 0.68V 0.68mW 2.4GHz PLL for Ultra-low Power RF Systems", 2015 IEEE Radio Frequency Integrated Circuits Symposium (RFIC), May 17-19, 2015, Phoenix, AZ, pp. 1-4.

Andrew Nelson et all, "A 22uW, 2.0GHz FBAR Oscillator", 2011 IEEE Radio Frequency Integrated Circuits Symposium (RFIC), Jun. 5-7, 2011, Baltimore, MD, pp. 1-4.

* cited by examiner

USING ACOUSTIC REFLECTOR TO REDUCE SPURIOUS MODES

FIELD OF THE DISCLOSURE

This relates to microelectromechanical system resonators.

BACKGROUND

Microelectromechanical system (MEMS) resonators are used for multiple applications, among them low-power, low-phase noise, high stability oscillators. Integrating the MEMS resonators with the integrated circuit chips in a regular semiconductor packaging is usually a challenging aspect of such devices. Multiple approaches have been used, such as: wire-bonding, flip-chip, CMOS-MEMS, etc.

A bulk acoustic wave (BAW) resonator is a MEMS device that includes a piezoelectric thin film sandwiched between two electrodes and acoustically isolated from the surrounding medium. BAW resonators using piezoelectric films with thicknesses ranging from several micrometers down to tenth of micrometers resonate in the frequency range of roughly 100 MHz to 10 GHz. Aluminum nitride and zinc oxide are two common piezoelectric materials used in MEMS acoustic wave resonators.

SUMMARY

An example micromechanical system (MEMS) resonator includes a base substrate. A piezoelectric layer has a first electrode attached to a first surface of the piezoelectric layer and a second electrode attached to a second surface of the piezoelectric layer opposite the first electrode. The first electrode is bounded by a perimeter edge. A patterned acoustic mirror is formed on a top surface of the first electrode opposite the piezoelectric layer, such that the patterned acoustic mirror covers a border strip of the top surface of the first electrode at the perimeter edge and does not cover an active portion of the top surface of the first electrode.

The MEMS resonator can be operated at its parallel resonance frequency. At this frequency, an acoustic wave is propagated laterally away from a central region of the MEMS resonator through the MEMS resonator. A patterned acoustic mirror in contact with a border region of the top electrode attenuates the propagating acoustic wave.

DETAILED DESCRIPTION OF EMBODIMENTS

Figure 1:
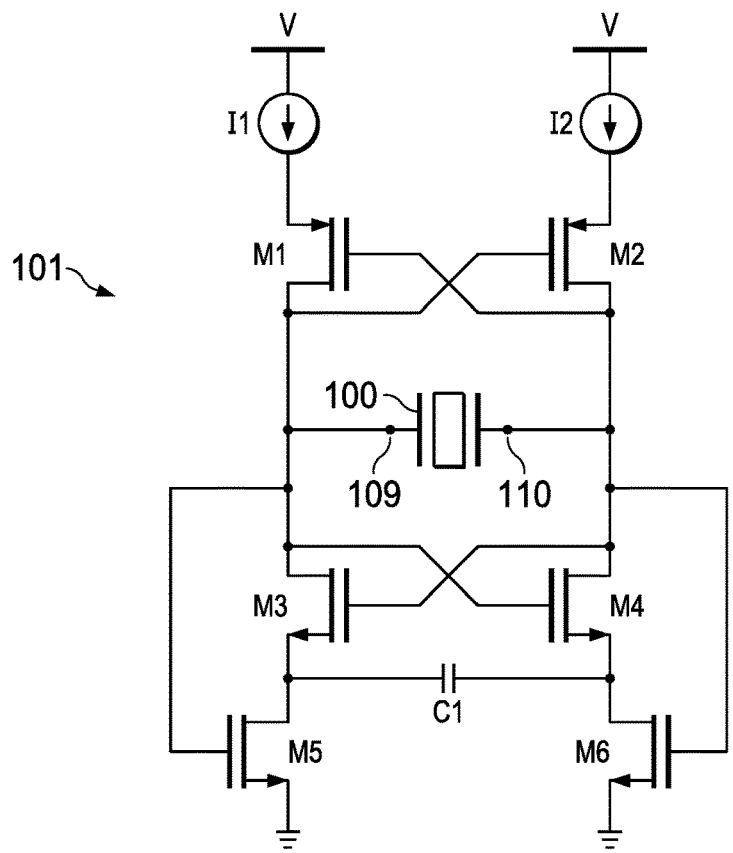
FIG. 1 is a schematic of an example oscillator circuit that includes a MEMS acoustic wave resonator device.

In the drawings, like elements are denoted by like reference numerals for consistency.

Microelectronic devices that include frequency selective components are important for many electronic products requiring stable frequency signals or ability to discriminate between signals based on frequency diversity. For resonant MEMS (microelectromechanical systems) devices, stability is important for good performance.

In thickness mode piezoelectric resonators, such as Bulk Acoustic Wave (BAW), Solidly Mounted Resonators (SMR), and Film Bulk Acoustic Resonators (FBARs), the parallel resonance frequency ($f_p$) exhibits a highly-dispersive mode of vibration whose vertical component shows large propagation in the lateral direction. As a result, this lateral energy leakage can affect the resonator quality factor at $f_p$ ($Q_p$), which is defined as the ratio of energy stored over the energy lost per cycle of vibration. In the case of small devices, the energy lost becomes dominated by acoustic losses. $Q_p$ is proportional to the resonator area over its perimeter.

As will be described in more detail hereinbelow, a guard ring formed by a patterned top acoustic mirror placed around a border region of the top electrode of a thickness mode piezoelectric resonator mitigates the amount of lateral acoustic energy leakage. For efficient energy confinement, the width of the border region overlaid by the acoustic mirror can be an odd multiple of $\lambda/4$, where $\lambda$ represents the lateral wavelength of the propagating acoustic wave leaving the resonator at the parallel resonance frequency.

One way to improve $Q_p$ as well as suppressing spurious modes near $f_p$, is to use a $\lambda/4$ acoustic frame constructed on the top surface at the edge of the top electrode. This technique relies on the ability of acoustic frames working as $\lambda/4$ transformers to reflect the propagating lateral waves; however, such acoustic frames are difficult to fabricate.

In the examples described herein, one advantage of using a defined acoustic reflector instead of acoustic frames is that an acoustic reflector is not constrained by the electrode, whose dimensions are set by other criteria such as required dielectric capacitance or matching network conditions. As a result, the acoustic mirror can be optimized to the point at which the vertical displacement becomes highly attenuated, minimizing the amount of energy leakage and improving $Q_p$.

FIG. 1 is a schematic of an oscillator circuit example 101 that uses a MEMS acoustic wave resonator 100 that includes a patterned acoustic mirror located in a border region of a top electrode. In this example, oscillator circuit 101 is implemented on a semiconductor substrate using complimentary metal-oxide semiconductor (CMOS) transistors, for example. In this example, current sources I1, I2 provide a constant current to cross coupled differential pair PMOS transistors M1, M2 and cross coupled differential pair NMOS transistors M3, M4. MEMS acoustic wave resonator 100 acts as an L-C tank circuit. NMOS transistors M5, M6, and capacitor C1 may be needed to reduce gain at low frequencies. MEMS acoustic wave resonator 100 may look like a capacitor at low frequency, but will look like an open circuit at DC (direct current) and the circuit might actually latch without the aid of transistors M5, M6.

MEMS acoustic wave resonator 100, also referred to as a "bulk acoustic wave" (BAW) resonator, includes a piezoelectric material sandwiched between two electrodes and acoustically isolated from the surrounding medium. MEMS acoustic wave resonator devices using piezoelectric films with thicknesses ranging from several micrometers down to tenth of micrometers resonate in the frequency range of roughly 100 MHz to 10 GHz. Aluminum nitride and zinc oxide are two common piezoelectric materials used in MEMS acoustic wave resonators.

In this example, MEMS acoustic wave resonator 100 is implemented on a semiconductor substrate that is separate from the semiconductor substrate on which oscillator circuit 101 is fabricated. MEMS acoustic resonator 100 may be mounted on the CMOS oscillator chip. Bond wires may be used to connect MEMS resonator terminals 109, 110 to bond pads on the CMOS oscillator chip. In another example, a MEMS acoustic wave resonator similar to MEMS acoustic wave resonator 100 may be fabricated on the same substrate that includes an oscillator circuit.

A typical MEMS acoustic wave resonator includes two electrodes positioned on opposite sides of a piezoelectric layer, similar to a capacitor. A thin Film Bulk Acoustic Resonator (FBAR) is a fully released structure and requires cavities below and above the resonator. A Solidly Mounted Resonator (SMR) uses an acoustic reflector, also referred to as an "acoustic mirror," below the bottom electrode to prevent acoustic energy from leaking to the substrate. An example BAW device, known as mirror-encapsulated BAW or dual-Bragg acoustic resonator (DBAR), typically includes two acoustic mirrors, one on each side of the piezoelectric layer and electrodes.

In a BAW resonator, the series resonance frequency ($f_s$) coincides with the thickness extensional (TE) mode near cut-off frequency. If the group velocity displayed by the TE mode is positive the resonator is defined as a Type I device. The slope of a dispersion curve for a Type I device is positive. On the other hand, if the group velocity displayed by the TE mode is negative the resonator is defined as a Type II device. The slope of a dispersion curve for a Type II device is negative.

MEMS resonator technology is a promising solution for timing and frequency filtering applications. However, many spurious modes exist in MEMS resonator devices, degrading the quality factor (Q) and the overall resonator performance. These spurious modes are higher harmonics of the first-order synchronous mode ($S_1$) Lamb wave and appear in the resonator frequency response between the series ($f_s$) and parallel ($f_p$) resonances for Type I BAW resonator and below the $f_s$ for Type II BAW. Modified boundary conditions involving the inclusion of border regions with either lower cut-off frequency than the active region ($f_{c,b} < f_{c,a}$) or higher cut-off frequency than the active region ($f_{c,b} > f_{c,a}$) have been used to suppress the spurious modes for Type I and Type II BAW resonator, respectively. Consequently, a common technique is to use a "raised frame or guard ring" in Type I BAW resonator and "recessed guard ring" in Type II BAW resonator. However, the guard ring structure is difficult to fabricate because it requires either an additional etching step of the electrode edge whose relative depth is difficult to control or deposit a second thin film in the active region.

Figure 2:
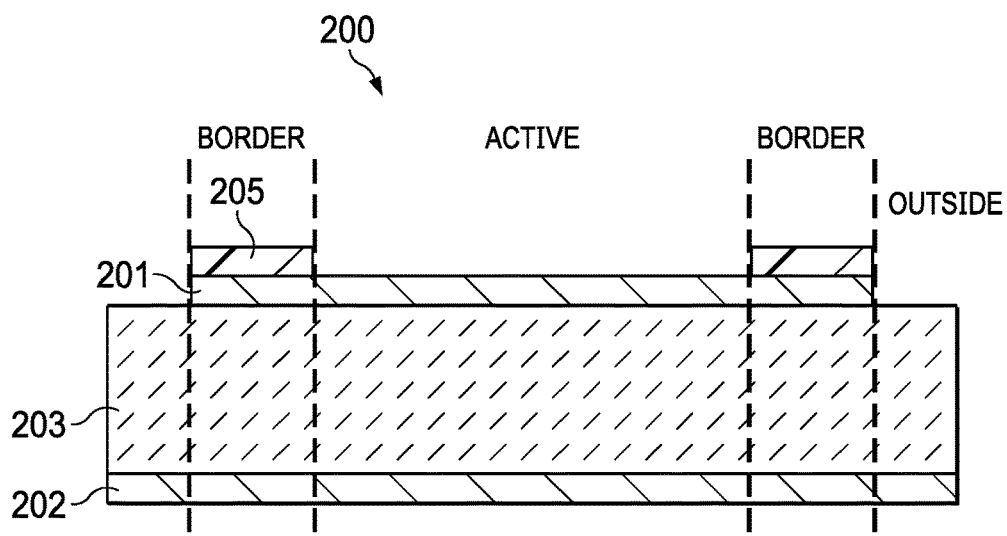
FIGS. 2-3 are cross sections of prior art MEMS resonators.

FIG. 2 is a simplified cross section of prior art MEMS resonator 200, which is a type I BAW resonator. BAW resonator 200 includes two electrodes 201, 202 positioned on opposite sides of a piezoelectric layer 203. An electrically conductive guard ring 205 is formed on the top surface of top electrode 201 in a border region adjacent the perimeter edge. Guard ring 205 may be fabricated with the same material as electrode 301.

Figure 3:
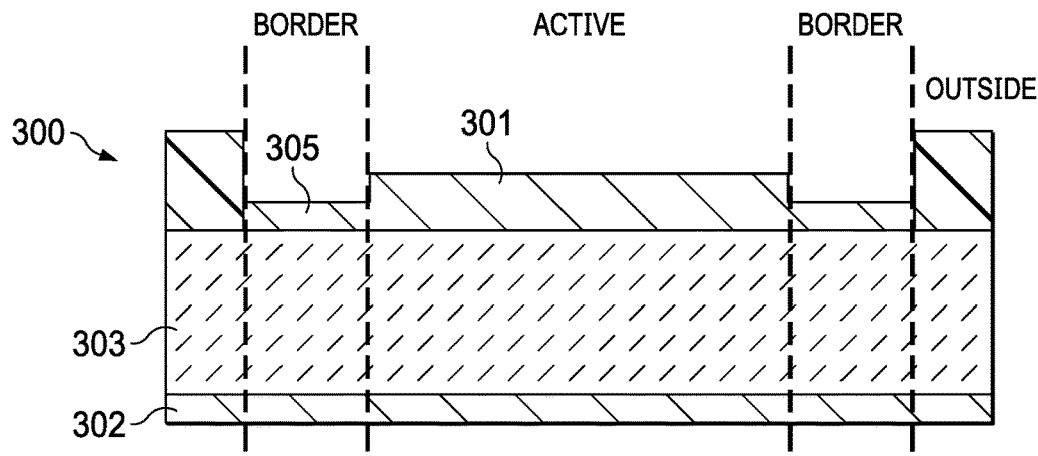

FIG. 3 is a simplified cross section of prior art MEMS resonator 300, which is a type II BAW resonator. BAW resonator 300 includes two electrodes 301, 302 positioned on opposite sides of a piezoelectric layer 303. A recessed guard ring 305 is formed on the top surface of top electrode 301 in a border region adjacent the perimeter edge.

Figure 4:
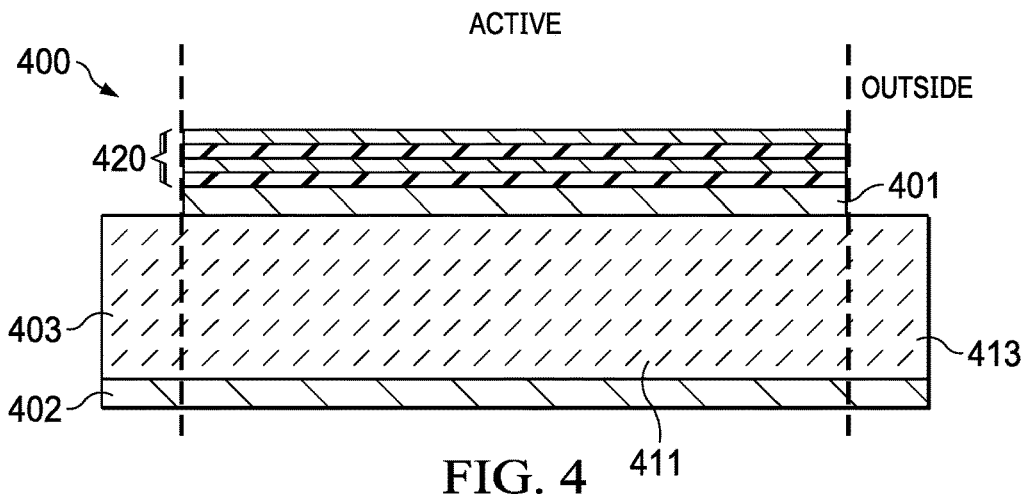
FIG. 4 is cross section of an example MEMS resonator with an acoustic mirror formed on the top electrode.

FIG. 4 is a simplified cross section of an example MEMS resonator 400 with an acoustic mirror 420 formed on the top electrode 401. BAW resonator 400 includes two electrodes 401, 402 positioned on opposite sides of an aluminum nitride (AlN) piezoelectric layer 403. A second acoustic mirror (not shown) is typically provided between bottom electrode 402 and a substrate (not shown). A device that uses an aluminum nitride piezoelectric acoustically isolated from the substrate is naturally a Type II device, with spurious modes (ripples) below the series resonance ($f_s$). The existence of these ripples in the vicinity of parallel resonance frequency $f_p$ is undesirable in many applications. Any ripples around the parallel resonance can cause the $Q_p$ (quality factor around $f_p$) and $Z_p$ (Impedance around $f_p$) to vary and thus may cause variation in the system performance.

It is desirable to confine the acoustic vibrations to active region 411 between the top and bottom electrodes 401, 402 and minimize propagation of the acoustic vibration to the region outside 413 beyond the top electrode 401 in order to minimize the spurious modes of vibration.

Figure 5:
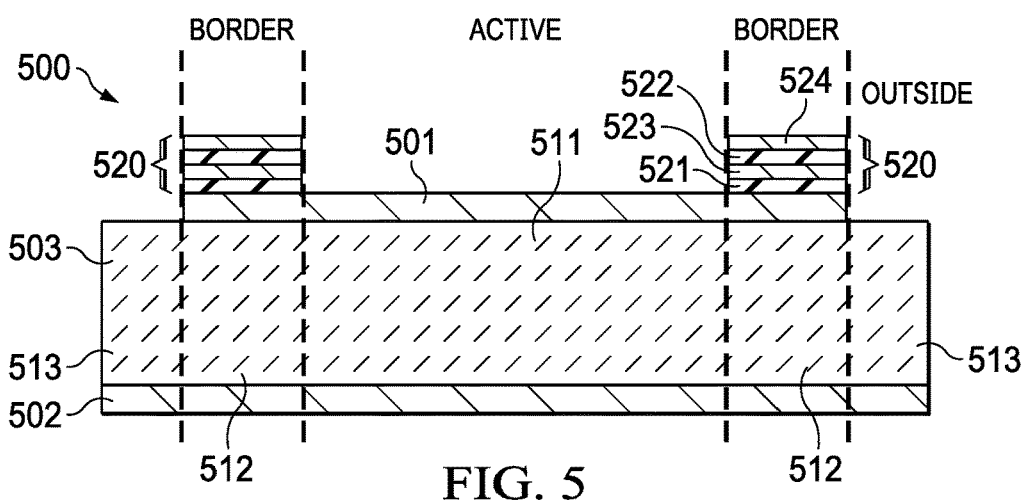
FIG. 5 is cross sections of an example MEMS resonator with an acoustic mirror formed on a border region of the top electrode.

FIG. 5 is cross sections of an example MEMS resonator 500 with a patterned acoustic mirror 520 formed on a border region 512 of the top electrode 501. In this example, after forming acoustic mirror 420 (FIG. 4), a portion of acoustic mirror 420 is patterned and removed from active region 511 such that a structure similar to a raised guard ring, such as raised guard ring 205 (FIG. 2) is formed on border region 512. However, patterned acoustic mirror 520 has the acoustic properties of a recessed guard ring, such as recessed guard ring 305 (FIG. 3).

In this example, acoustic reflector 520 is a distributed Bragg reflectors (DBR). A DBR is a structure formed from multiple layers of alternating materials with varying acoustic impedance. Each layer boundary causes a partial reflection of an acoustic wave. For bulk acoustic waves whose wavelength is close to four times the thickness of the layers, the many reflections combine with constructive interference, and the layers act as a high-quality reflector. Any known or later developed Bragg mirror, dielectric mirror, acoustic reflector, etc. may be used to implement the acoustic reflector 520. The example acoustic reflector 520 includes alternating layers of materials with different acoustic impedances. In some examples, acoustic reflector 520 includes: (a) alternating flat conductive members (e.g., layers, sheets, plates, etc. of metal), two of which are designated by reference numerals 523 and 524; and (b) flat dielectric members (e.g., layers, sheets, plates, etc. of a dielectric material), two of which are designated by reference numerals 521 and 522. The thicknesses of and distances between the conductive members 521 and 522 are selected based on an intended resonance frequency of the BAW resonator 500. As a result, the patterned acoustic reflector 520 reduces spurious modes, and it confines (such as by reflecting, directing, containing, etc.) acoustic energy of the main mode at that frequency in piezoelectric layer 503 and the two electrodes 501 and 502 which together act as a resonant cavity of the BAW resonator 500. In some examples, the conductive members 523, 524 are formed by tungsten (W), titanium tungsten (TiW) or copper (Cu). In some examples, the dielectric members 521, 522 are formed by silicon dioxide (SiO2), or a carbon doped oxide dielectric (such as SiCOH), or aluminum nitride (AlN). In some examples, the acoustic reflector 520 may be implemented using a two-dimensional (2D) or a three-dimensional phononic crystal. Bottom electrode 502 may be formed in contact with an adjacent Bragg mirror (not shown) that is mounted on a substrate (not shown).

Figure 6A:
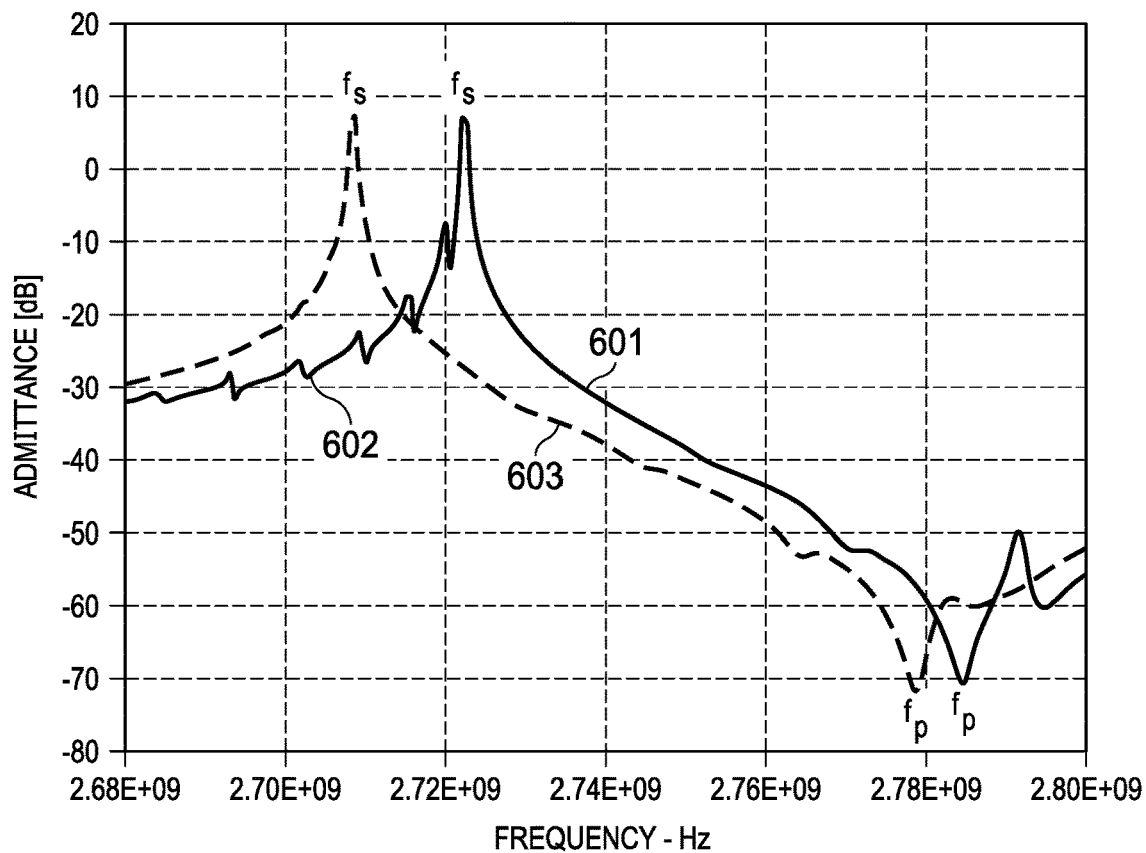
FIGS. 6A-6B are plots illustrating operation of the MEMS resonators of FIGS. 4-5.
Figure 6B:
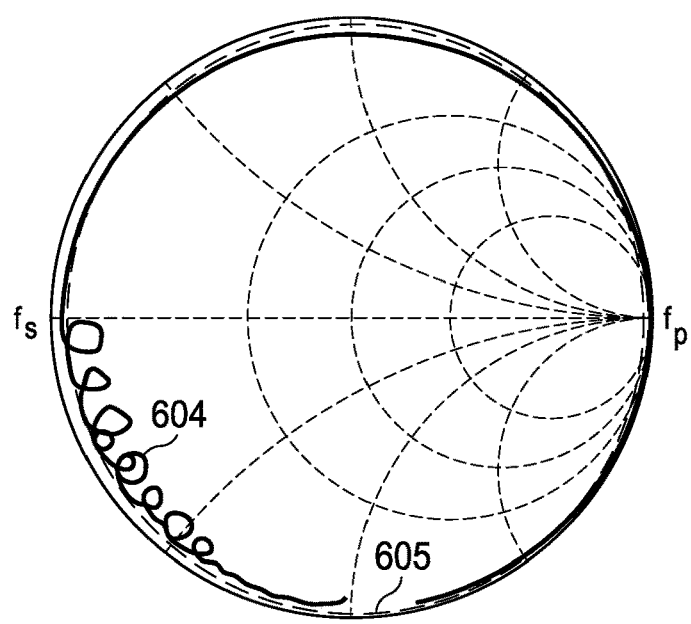

FIGS. 6A-6B are plots illustrating operation of the MEMS resonators of FIGS. 4-5. FIG. 6A illustrates admittance vs frequency, while FIG. 6B is a Smith Chart illustrating reflection coefficient. As explained above, a patterned acoustic mirror located over a border region of the top electrode of a MEMS resonator suppresses spurious modes as well as the recessed structure illustrated in FIG. 3. Plot line 601 illustrates an admittance response of example MEMS resonator 400 (FIG. 4) that has a solid acoustic mirror overlying the entire top electrode 401 (FIG. 4). Notice the spurious modes below fs at 602 in FIG. 6A and at 604 in FIG. 6B.

Plot line 603 illustrates an admittance response of example MEMS resonator 500 (FIG. 5) that has a patterned acoustic mirror 520 (FIG. 5) located over border region 512 (FIG. 5). Plot line 605 illustrates the reflection coefficient of example MEMS resonator 500. In this example, essentially all spurious modes below fs are eliminated by the patterned acoustic mirror.

Figure 7A:
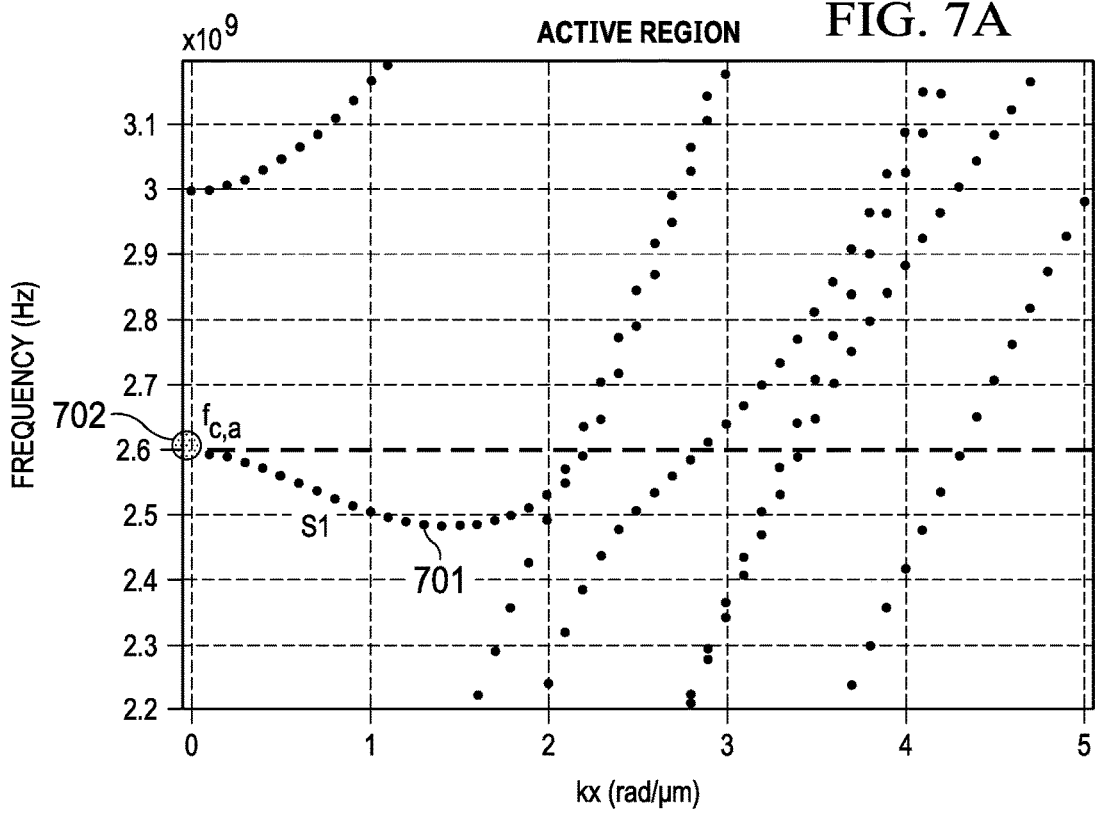
FIGS. 7A-7B are dispersion plots illustrating operation of different regions of the MEMS resonator of FIG. 5.
Figure 7B:
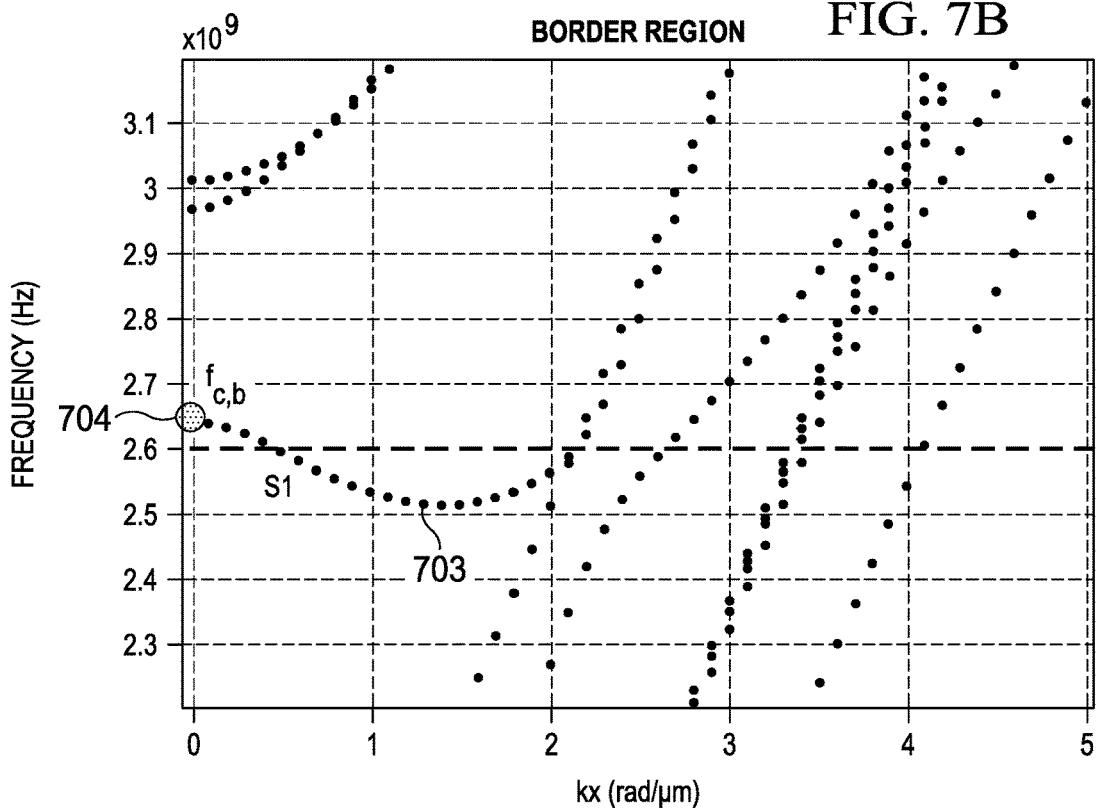

FIGS. 7A-7B are dispersion plots illustrating operation of different regions of the MEMS resonator of FIG. 5. FIG. 7A represents active region 511, FIG. 7B represents border region 512. A patterned Bragg mirror, such as patterned Bragg mirror 520 (FIG. 5) can increase the cut-off frequency of the S1 vibration mode in the border region (fc, b) over the cut-off frequency of the S1 vibration mode in the active region (c,a) of a MEMS resonator, such as active region 511 of example MEMS resonator 500. In other words, fc,b>fc,a, which replicates the acoustic properties of a recessed guard ring in a Type II BAW. To prove this statement, FIG. 4 compares the dispersion diagrams of the active and border regions in a Type II BAW and highlights the location of fc,b relative to fc,a.

In this example, the dispersion characteristics of the active region 511 and the border region 512 is determined by separate finite element simulations. The dotted line plots represent the dispersion characteristic of the two material stacks in regions 511, 512. The various dotted line plots illustrate what modes of vibrations (or eigenfrequencies) are possible assuming the specific layer thicknesses and composition of the materials. The general forms of the wave equation that apply to longitudinal and shear waves are given by expressions (1) and (2), respectively. In these expressions, $k_y$ represents the transversal component of the wavenumber, $k_x$ represents the longitudinal component of the wavenumber or propagation factor, $\omega$ represents the resonance frequency, and $V_l$ and $V_s$ represent the longitudinal and shear velocities, respectively. The wavenumber is defined as the number of radians per unit distance. The relationship between $k_x$ and the propagation wavelength ($\lambda$) is given by expression (3).

$$k_y^2 = \left(\frac{\omega}{V_l}\right)^2 - k_x^2 \quad (1)$$

$$k_y^2 = \left(\frac{\omega}{V_s}\right)^2 - k_x^2 \quad (2)$$

$$k_x = \frac{2\pi}{\lambda} \quad (3)$$

The $S_1$ plot corresponds to the first-order symmetric mode and $k_x$ represents the wavenumber that relates to the propagation wavelength ($\lambda$). The other dotted plot lines represent other modes of vibration that are possible within the simulated regions 511, 512. The remaining plot lines represent various known modes of acoustic vibration that are possible in the simulated stack-up of materials, such as zeroth-order asymmetrical, zeroth-order symmetrical, etc. A dispersion plot of frequency vs longitudinal component of the wave number ($k_x$) may be prepared based on a simulation that plots various vibration modes that are possible within the block of simulated material. The mode of vibration that matches the dominate mode of vibration for the device is then selected from the dispersion plot and used to determine the wavelength of a propagating wave at the resonant frequency $f_p$.

Referring to FIG. 7A, $S_1$ plot line 701 illustrates simulated operation in the active region 511. Point 702 illustrates a cut-off frequency in the active region of approximately 2.6 GHz. Referring to FIG. 7B, $S_1$ plot line 703 illustrates simulated operation in the border region 512. Point 704 illustrates a cut-off frequency in the border region of approximately 2.65 GHz. Thus, fc,b>fc,a, which replicates the acoustic properties of a recessed guard ring in a Type II BAW.

An advantage with respect to previous solutions are manufacturability and reliability. Fabrication of a recessed guard ring requires either etching the electrode edge, with the consequences that this has on altering the mechanical properties and varying fs across the wafer, or depositing a second thin film over the active region. At several GHz frequencies, the electrode thickness is very small and it does not allow much variation of the cut-off frequency. As a result, depositing a very thin layer on top of the electrode can create an undesired second resonance between fs and fp.

Figure 8:
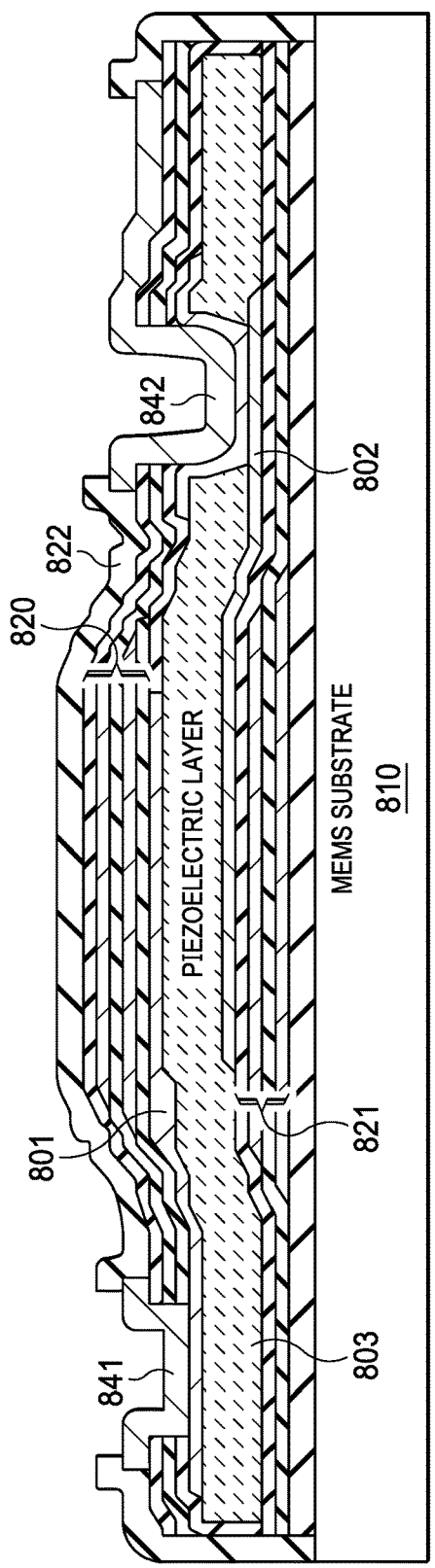
FIGS. 8-9 are more detailed cross-sectional views illustrating fabrication of an example Bulk Acoustic Wave (BAW) resonator device having a border acoustic reflector.
Figure 9:
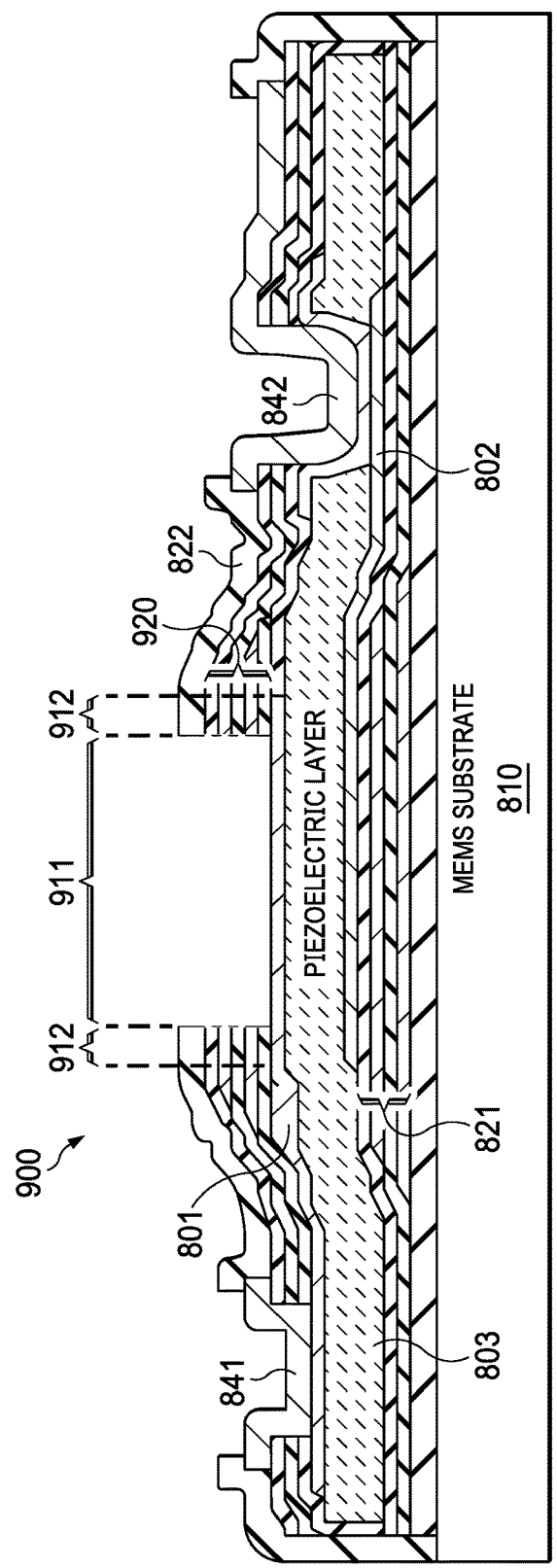

FIGS. 8-9 are more detailed cross-sectional views illustrating fabrication of an example BAW resonator device 900 having a patterned acoustic reflector. Using known or later developed semiconductor processing techniques, a lower Bragg mirror 821 is built up layer by layer on a substrate 810. Lower electrode 802 is then deposited and patterned to provide a connection to contact 842. Piezoelectric layer 803 is then deposited and patterned. Upper electrode 801 is then deposited and patterned to provide a connection to contact 841. Upper Bragg mirror 820 is then built up layer by layer. The entire assembly can then be overlaid by a protective overcoat 822 of silicon nitride or silicon dioxide, for example.

Referring to FIG. 9, an opening 911 in the Bragg mirror is formed by patterning and etching the assembly illustrated in FIG. 8 to form patterned Bragg mirror 920. In another example, each layer of Bragg mirror 920 may be patterned and etched during each deposition of the layers that make up Bragg mirror 920.

Figure 10:
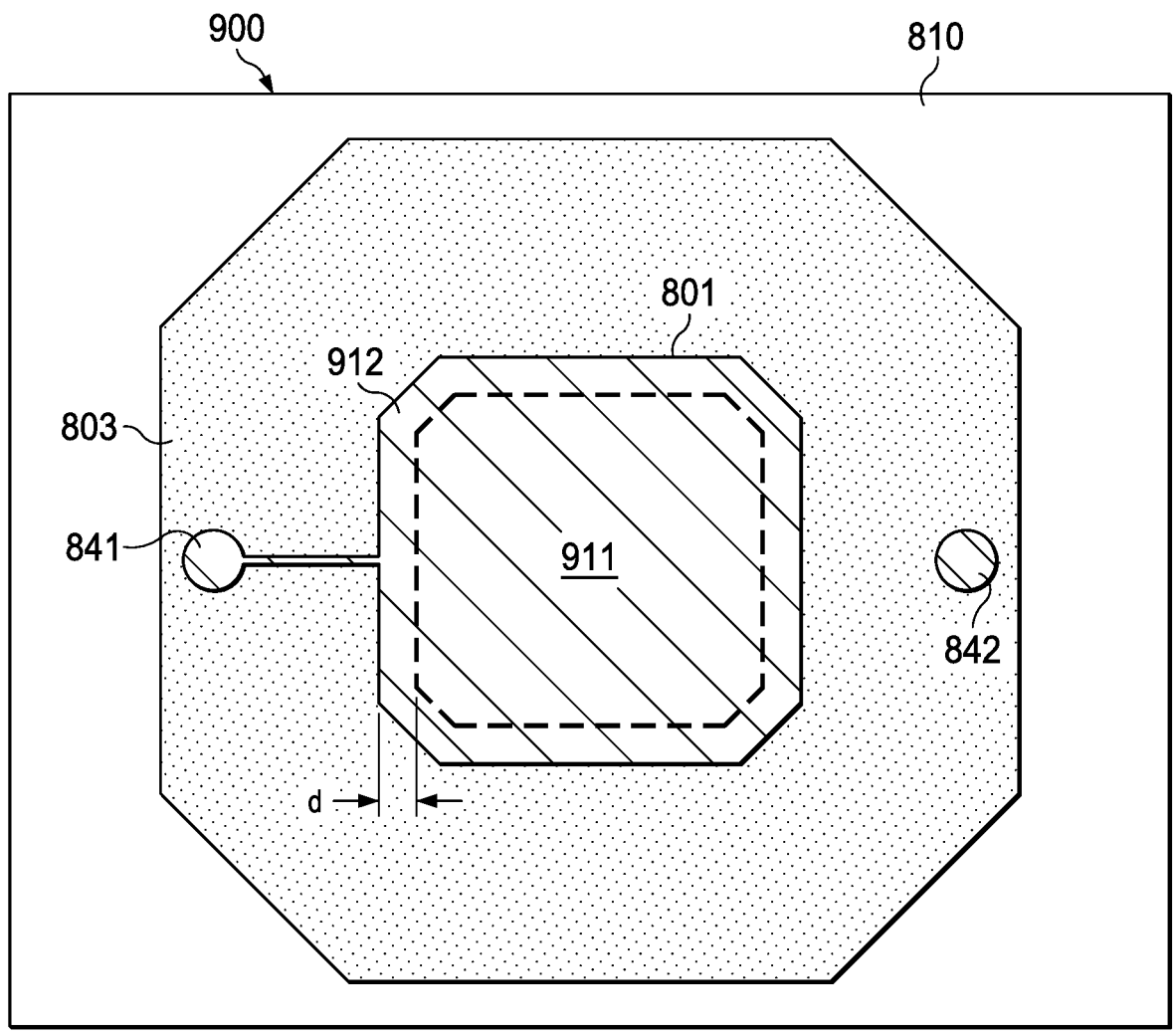
FIGS. 10-12 are top views of alternate examples of the BAW device of FIG. 9.

FIG. 10 is a top view of the example MEMS acoustic wave resonator device 900 of FIG. 9, showing the top electrode 801 prior to fabricating the Bragg mirror. In this example, top electrode 801 has a polygon shape that is essentially octagonal. A border region 912 will be covered with the patterned Bragg mirror 920 (FIG. 9), leaving active region 911 exposed. Border region 912 has a uniform width d that is selected to be an odd multiple of a quarter wavelength of the propagating fp acoustic signal at a selected operating frequency.

Figure 11:
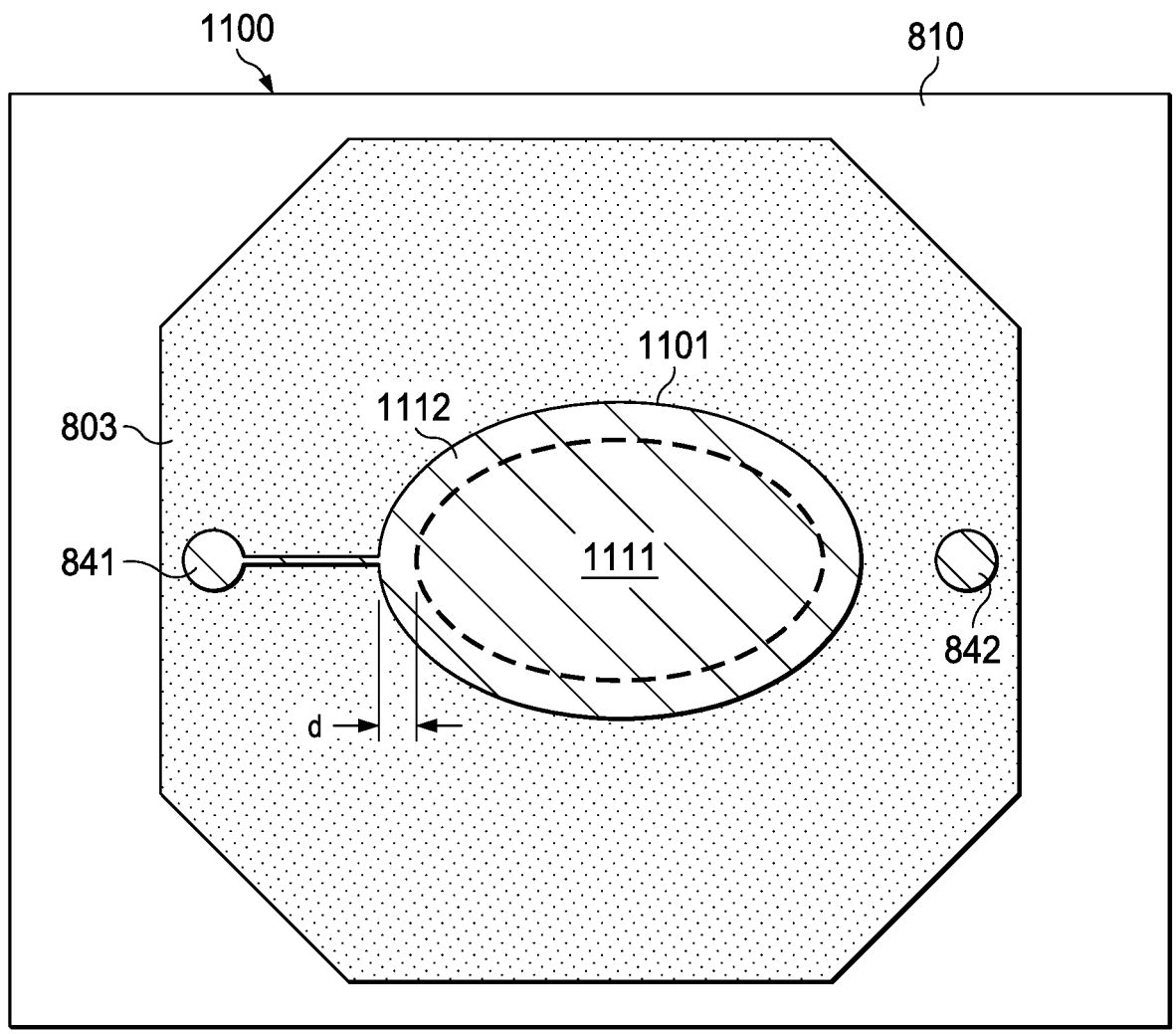

FIG. 11 is another example of a top view of an example MEMS acoustic wave resonator 1100 that is similar to MEMS acoustic wave resonator 900 of FIG. 9. In this example, the upper electrode 1001 is oval shaped. A border region 1112 will be covered with the patterned Bragg mirror similar to 920 (FIG. 9), leaving active region 1111 exposed. Border region 1112 has a uniform width d that is selected to be an odd multiple of a quarter wavelength of the propagating fp acoustic signal at a selected operating frequency.

Figure 12:
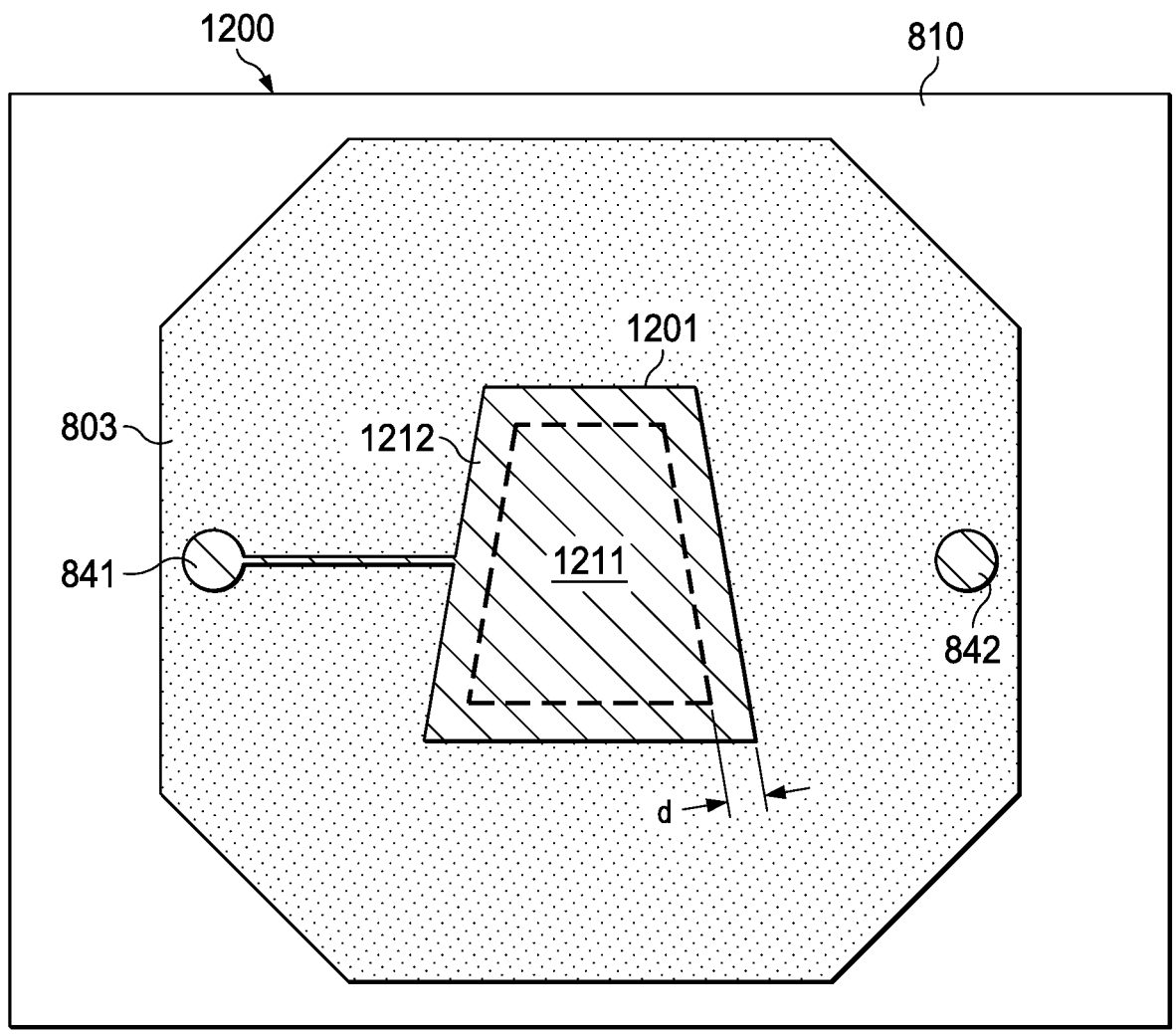

FIG. 12 is another example of a top view of an example MEMS acoustic wave resonator 1200 that is similar to MEMS acoustic wave resonator 900 of FIG. 9. In this example, the upper electrode 1201 is polygon shaped. A border region 1212 will be covered with the patterned Bragg mirror similar to 920 (FIG. 9), leaving active region 1211 exposed. Border region 1212 has a uniform width d that is selected to be an odd multiple of a quarter wavelength of the propagating fp acoustic signal at a selected operating frequency.

In other examples, the upper electrode may have various shapes, such as round, square, triangular, etc. In each case, a patterned acoustic mirror is formed on a border region at the perimeter of the upper electrode.

Figure 13:
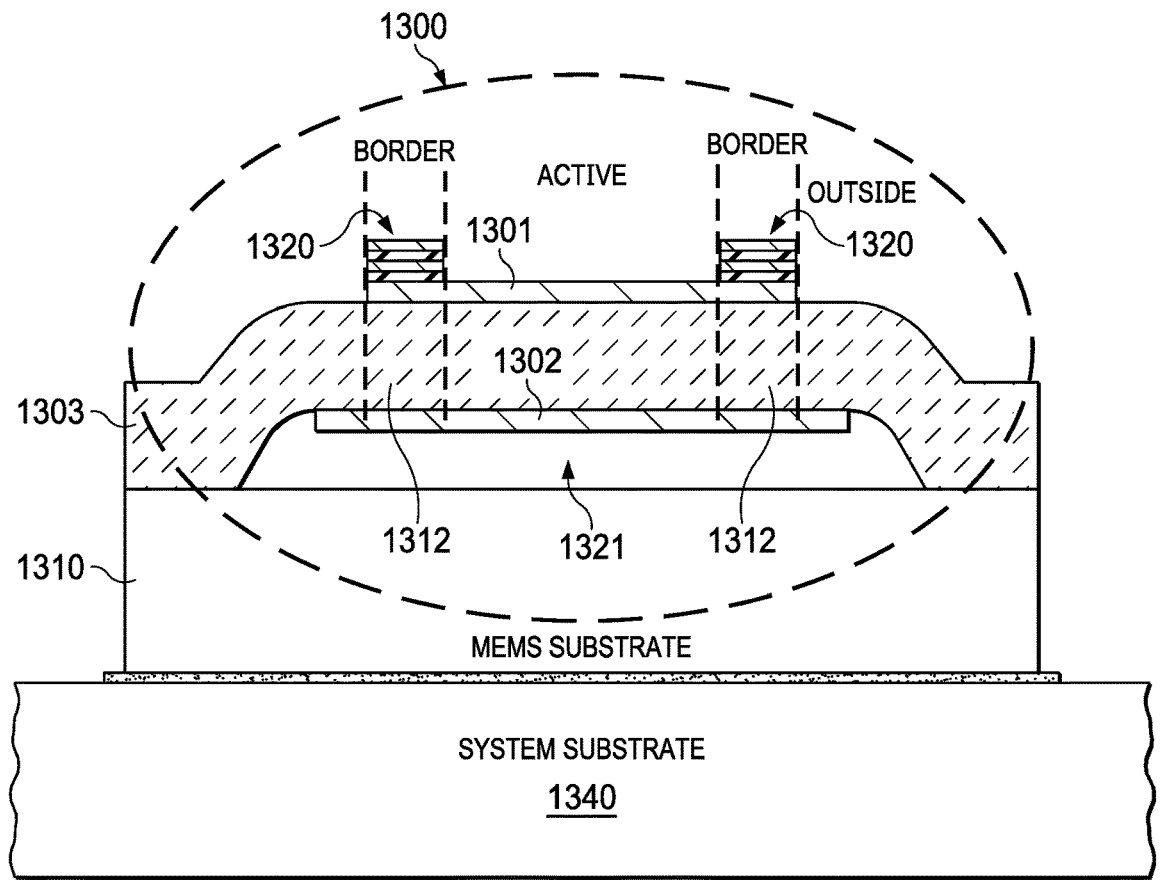
FIG. 13 is cross sectional view of an example Film Bulk Acoustic Resonator (FBAR) device with an acoustic mirror formed on the top electrode.

FIG. 13 is a cross section view another example MEMS acoustic wave resonator 1300 that is a fully released resonator structure, referred to as a "film bulk acoustic resonator" (FBAR). FBAR 1300 includes a piezoelectric member 1303 with an electrode 1302 formed on the bottom side and an electrode 1301 formed on the top side. Piezoelectric layer 1303 is formed on substrate 1320 but is separated from substrate 1320 to form a "released volume" 1321 in the active region of MEMS device 1300 to allow the piezoelectric layer to vibrate freely. In this example, a lower acoustic reflector is not needed. Similar to MEMS device 900 (FIG. 9), a patterned Bragg mirror 1320 encircles top electrode 1301 and covers a border region 1312 at the perimeter edge of electrode 1301 by a distance d, equal to an odd multiple of $\lambda/4$ ($\lambda/4$, $3\lambda/4$, $5\lambda/4$ ... etc.).

In this example, patterned Bragg mirror 1320 covers just the border region 1312 above top electrode 1301. In another example, the Bragg mirror may extend beyond the border region to cover a portion of the outside region, such as illustrated in FIG. 9.

In this example, FBAR 1300 is mounted to a system substrate 1340, which is a substrate for an integrated circuit.

Figure 14:
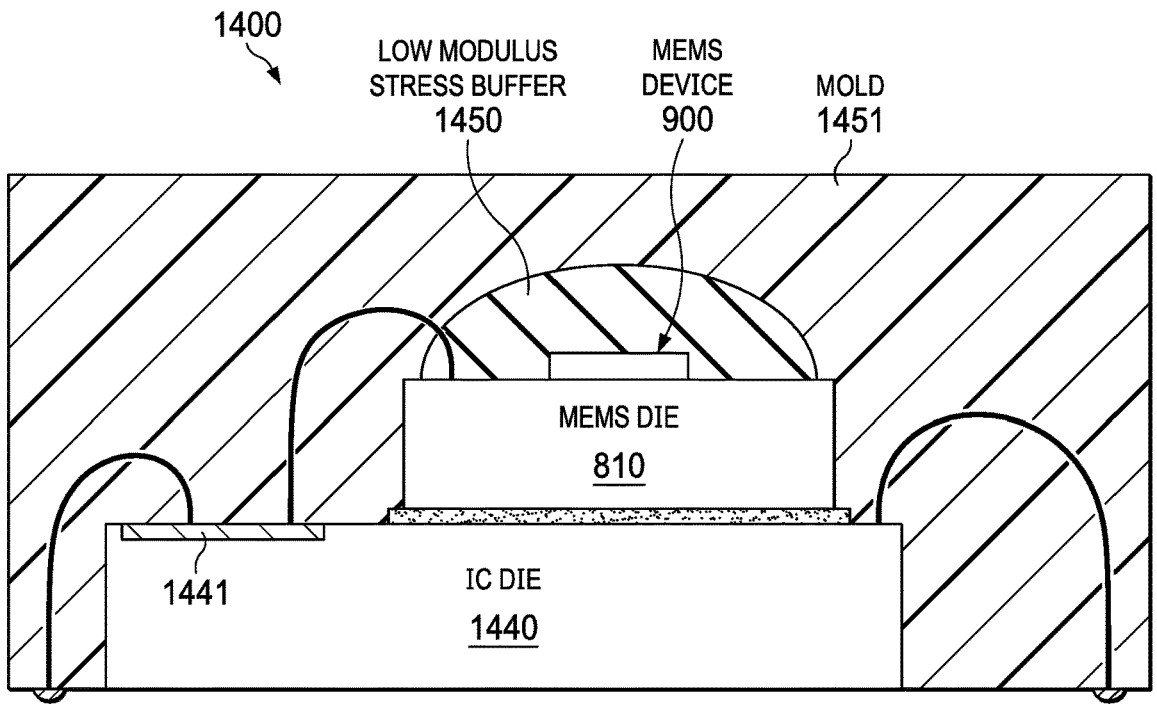
FIG. 14 is a cross sectional view of an example packaged integrated circuit that includes an example MEMS acoustic wave resonator.

FIG. 14 is a cross sectional view of an example package integrated circuit 1400 that includes the example MEMS resonator 900 of FIG. 9. IC die 1440 and MEMS die 810 are encapsulated with mold compound 1451, using a known or later developed encapsulation process.

In this example, a material 1450 that has a low modulus of elasticity may be placed over MEMS resonator 900 to prevent high modulus mold compound 1451 from touching BAW resonator 1200. In this manner, low modulus material 1450 acts as a stress buffer and provides a stress-free structure for BAW resonator 1200 within an encapsulated package 1400.

In another example, a protective "cavity wafer" or "hard hat" may be placed over MEMS acoustic wave resonator 900 to prevent mold compound from touching MEMS acoustic wave resonator 900. IC die 1440 and MEMS die 810 may then be encapsulated with mold compound using a known or later developed encapsulation process.

Other examples of MEMS resonators, such as MEMS resonator 1300 of FIG. 13, may be encapsulated in a similar manner.

Figure 15:
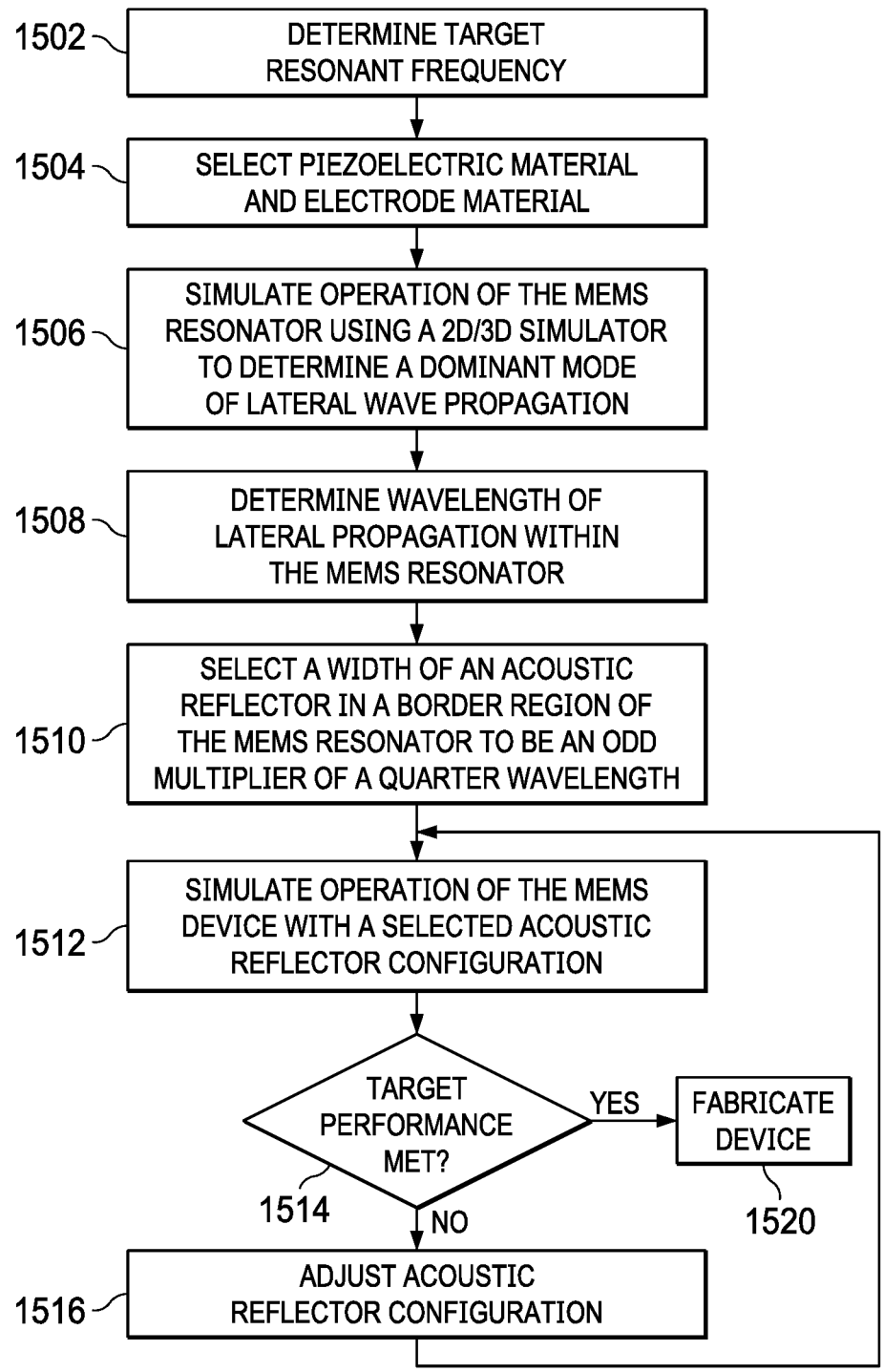
FIG. 15 is a flow chart illustrating design of a MEMS resonator device.

FIG. 15 is a flow chart illustrating design of a MEMS resonator device, such as any of the MEMS devices 500, 900, 1300 described hereinabove. As discussed in more detail hereinabove, in thickness mode piezoelectric MEMS resonators, such as a BAW device, a SMR device, or a FBARs device, the parallel resonance frequency (fp) exhibits a highly-dispersive mode of vibration whose vertical component shows large propagation in the lateral direction. As a result, this lateral energy leakage can affect the resonator quality factor at $f_p$ ($Q_p$), which is defined as the ratio of energy stored over the energy lost per cycle of vibration. In the case of small devices, the energy lost becomes dominated by acoustic losses. $Q_p$ is proportional to the resonator area over its perimeter. A patterned acoustic mirror placed over a border region of the top electrode of a thickness mode piezoelectric resonator mitigates the amount of lateral acoustic energy leakage. For efficient energy confinement, the width of the border region covered by the patterned acoustic mirror can be an odd multiple of $\lambda/4$, where $\lambda$ represents the lateral wavelength of the propagating acoustic mode leaving the resonator at the parallel frequency. The patterned acoustic mirror is placed within the border region of the area of vibration, which is delimited by the top electrode.

At 1502, a designer first selects a target resonant frequency for a MEMS device. MEMS resonator devices using piezoelectric films with thicknesses ranging from several micrometers down to tenth of micrometers resonate in the frequency range of roughly 100 MHz to 10 GHz.

At 1504, a designer selects what materials will be used to fabricate the piezoelectric layer, electrodes, and acoustic mirror(s). Aluminum nitride and zinc oxide are two common piezoelectric materials used in MEMS resonators. In some examples, the conductive members are formed by tungsten (W), titanium tungsten (TiW) or copper (Cu). In some examples, the dielectric members are formed by silicon dioxide (SiO2), or a carbon doped oxide dielectric (such as SiCOH), or aluminum nitride (AlN).

At 1506, operation of an initial configuration of the MEMS resonator is simulated to determine a dominate mode of vibration of a lateral wave propagating away from the active area of the MEMS resonator. Operation of the pending MEMS device design is simulated using a two dimensional (2D) or three dimensional (3D) finite element simulator. A BAW resonator presents lateral standing waves which degrades its electrical performance. 2D/3D simulations are needed to predict the allocation and the effect of these lateral modes. Several known or later developed 2D/3D finite element simulator are available for this task.

The wavelength of the lateral propagating wave is determined. A dispersion plot of frequency vs longitudinal component of the wave number ($k_x$) may be prepared based on the simulation that plots various vibration modes that are possible within the block of simulated material. The mode of vibration that matches the dominate mode of vibration for the device is then selected from the dispersion plot and used to determine the wavelength of a propagating wave at the resonant frequency $f_p$ in the metalized region adjacent the top electrode.

At 1510, a width of the border region of the top electrode is selected to be an odd integer multiple of $\lambda/4$. A width and a stack-up configuration for the acoustic mirror above the border region is then selected to match the width of the border region.

At 1512, operation of the MEMS device is simulated using the selected width and layer stack-up configuration.

At 1514, if the target performance parameters are not met by the pending design, at 1516 the designer may adjust the width of the border region and/or the number and thickness of layers in the acoustic mirror and repeat the simulation at 1512 using the adjusted parameters. This loop may be repeated several times with various combinations acoustic mirror parameters until an acceptable design is determined.

At 1520, a design that meets target performance goals may then be fabricated using known or later developed semiconductor processing techniques with the parameters determined using this process.

While an acoustic mirror covering a border region width equal to odd n $\lambda/4$ of $f_p$ in the metalized region, acceptable operation may be obtained within a range of +/−10% of the calculated values. As used herein, the term "$\lambda/4$" includes +/−10% $\lambda/4$. Devices designed to operate at a higher or at a lower target frequency will have patterned acoustic mirror parameters selected to match the target frequency.

Figure 16:
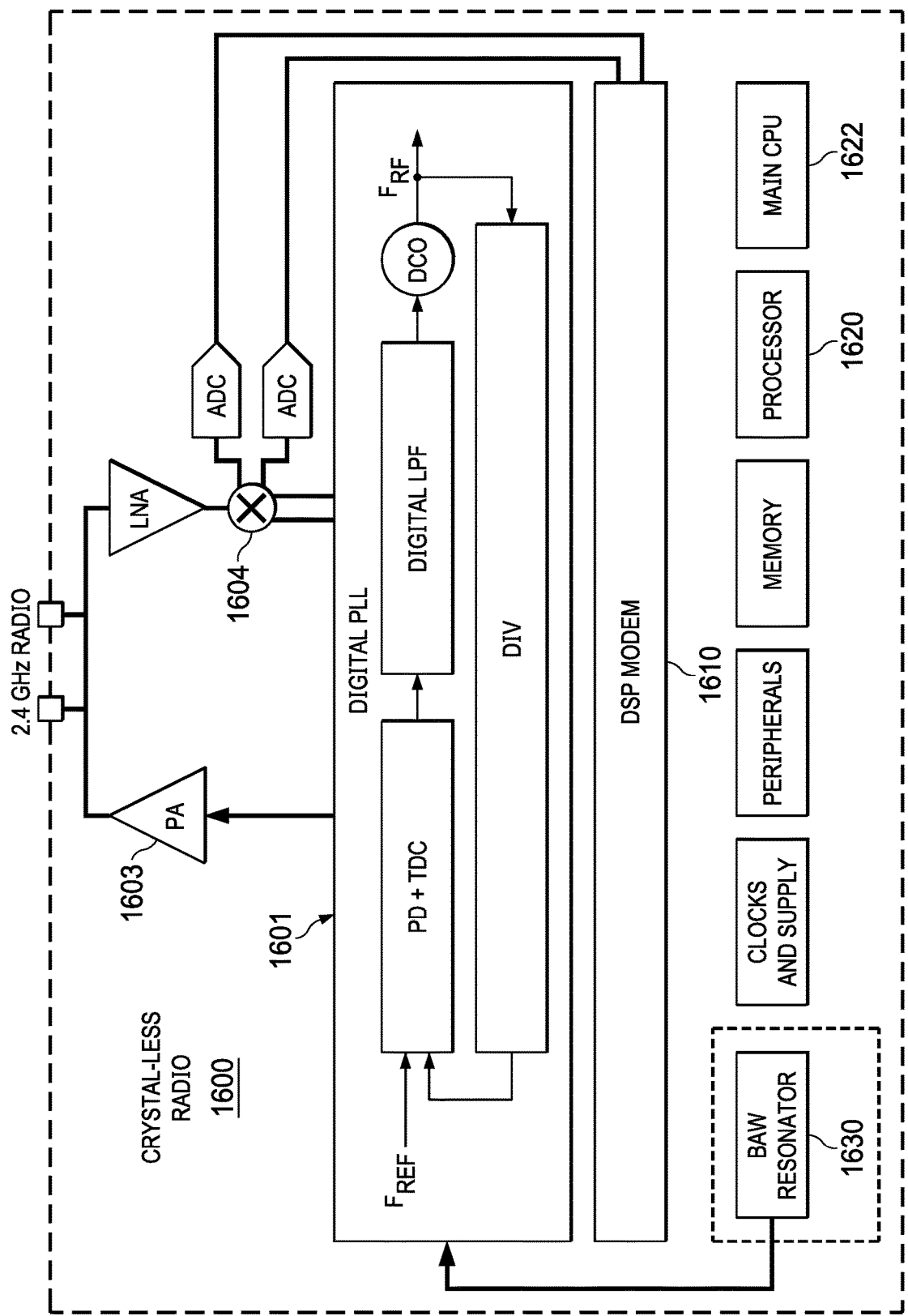
FIG. 16 is a block diagram if an example system-on-chip that includes an example MEMS acoustic wave resonator.

FIG. 16 is a block diagram if an example system on chip (SoC) 1600 that includes an example MEMS acoustic wave resonator 1630. In this example SoC 1600 is a wireless micro control unit (MCU) with a BAW resonator in a quad flat no-lead (QFN) package that provides a reduced overall footprint. Advantageously, use of BAW resonator 1630 eliminate the need for an external crystal to control the radio frequency (RF) signal for the 2.4 GHz radio transceiver and clock signals for processors 1620, 1622. In this example, BAW resonator 1630 is similar to BAW resonator 900 (FIG. 9). In another example, BAW resonator 1630 may be similar to FBAR resonator 1300, for example.

Digital phase locked loop (DPLL) 1601 uses a reference frequency signal provided by BAW resonator 1630 to generate an RF signal that is provided to power amplifier 1603 for wireless transmission of data produced by on-chip processor 1620 and/or 1622. RF receiver 1604 includes a low noise amplifier (LNA) that receives wireless signals. The received signals are then down-converted and digitalized using analog to digital converters (ADC) and then provided to DSP modem 1610. DSP modem extracts digital information from the received signals and provides the digital information to processor 1620 and/or main CPU 1622.

SoC 1600 is a low-power multi-standard device supporting Zigbee, Thread, Bluetooth Low Energy, and proprietary 2.4-GHz connectivity on a single chip. Enabling more design options and flexibility in a wider range of applications and environments, SoC 1600 is designed to work in the full −40° C. to 85° C. temperature range, unlike many crystal-based solutions.

OTHER EMBODIMENTS

In described examples, a single MEMS acoustic wave resonator is mounted on a substrate, but in other examples there may be two or more MEMS resonators mounted on one or more substrates.

In described examples, the upper electrode is essentially octagonal. In other examples, the upper electrode may be round, oval, square, rectangular, or any polygon shape. Irregular polygon layouts help to suppress spurious modes.

The example IC package 1400 of FIG. 14 is a surface mount device with a plurality of contacts on a bottom side of the package. However, in other examples, the IC package may be any of a number of known or later developed configurations, and may have various form, material(s), shapes, dimension(s), number of contacts, shape of contacts, etc. Moreover, the MEMS acoustic wave resonator(s) and/or any other components may be packaged, mounted, etc. in the IC package in various configurations. Other example IC packages may be, for example, a wafer-level package or a die-level package.

In described examples, a wireless MCU is illustrated. In other examples, a MEMS device may be used to generate various types of oscillator signals, be used in filter circuits, etc.

In another example, more than one MEMS device may be connected to circuitry and packaged in a single integrated circuit package.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board. Another example may include packages that are entirely encased in mold compound, such as a dual inline package (DIP).

In another example, the MEMS device may be fabricated using an additive manufacturing process. Additive manufacturing has enabled the deposition of patterned materials in a rapid and cost-efficient manner. Additive manufacturing processes are now being used in several areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

The term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A micromechanical system (MEMS) resonator comprising:
   a base substrate;
   a piezoelectric layer, coupled to the base substrate, having a first electrode attached to a first surface of the piezoelectric layer and a second electrode attached to a second surface of the piezoelectric layer opposite the first electrode, the first electrode being bounded by a perimeter edge; and a patterned acoustic mirror formed on a top surface of the first electrode opposite the piezoelectric layer, such that the patterned acoustic mirror covers a border strip of the top surface of the first electrode at the perimeter edge and does not cover an active portion of the top surface of the first electrode.

2. The MEMS resonator of claim 1, wherein the border strip of the top surface has a width equal to an odd multiple of one-fourth of a wavelength of a lateral propagating acoustic wave at a parallel resonant frequency of the MEMS resonator in a region abutting the acoustic mirror.

3. The MEMS resonator of claim 1, wherein the acoustic mirror is a distributed Bragg reflector having alternating layers with different acoustic impedance.

4. The MEMS resonator of claim 1, further comprising an acoustic mirror adjacent the second electrode and extending beyond the perimeter edge of the first electrode.

5. The MEMS resonator of claim 1, wherein the patterned acoustic mirror extends beyond the perimeter edge of the first electrode.

6. The MEMS resonator of claim 1, wherein the patterned acoustic mirror does not extend beyond the perimeter edge of the first electrode.

7. The MEMS resonator of claim 1, wherein the second electrode is separated from and spaced apart from the base substrate to form a released volume.

8. The MEMS resonator of claim 1, wherein the first electrode has a planar shape selected from a group consisting of: circular, oval, square, rectangular, trapezoidal, and an irregular polygon.

9. A method of operating a micromechanical system (MEMS) resonator, the method comprising:
operating the MEMS resonator at a parallel resonance frequency, wherein the MEMS resonator includes a first electrode and a second electrode separated by a piezoelectric layer;
propagating an acoustic wave laterally away from a central region of the MEMS resonator through the MEMS resonator; and
attenuating the acoustic wave with a patterned acoustic mirror located on a border region at a perimeter of the first electrode.

10. A packaged system comprising:
an integrated circuit substrate having circuitry formed thereon;
a micromechanical system (MEMS) resonator mounted on the integrated circuit substrate, the MEMS resonator comprising:
a base substrate;
a piezoelectric layer, coupled to the base substrate, having a first electrode attached to a first surface of the piezoelectric layer and a second electrode attached to a second surface of the piezoelectric layer opposite the first electrode, the first electrode being bounded by a perimeter edge; and
a patterned acoustic mirror formed on a top surface of the first electrode opposite the piezoelectric layer, such that the patterned acoustic mirror covers a border strip of the top surface of the first electrode at the perimeter edge and does not cover an active portion of the top surface of the first electrode.

11. The packaged system of claim 10, wherein the border strip of the top surface has a width equal to an odd multiple of one-fourth of a wavelength of a lateral propagating acoustic wave at a parallel resonant frequency of the MEMS resonator in a region abutting the acoustic mirror.

12. The packaged system of claim 10, wherein the acoustic mirror is a distributed Bragg reflector having alternating layers with different acoustic impedance.

13. The packaged system of claim 10, further comprising an acoustic mirror adjacent the second electrode and extending beyond the perimeter edge of the first electrode.

14. The packaged system of claim 10, wherein the patterned acoustic mirror extends beyond the perimeter edge of the first electrode.

15. The packaged system of claim 10, wherein the patterned acoustic mirror does not extend beyond the perimeter edge of the first electrode.

16. The packaged system of claim 10, wherein the second electrode is separated from and spaced apart from the base substrate to form a released volume, such that the released volume extends beyond a perimeter of the first electrode.

17. The packaged system of claim 10, wherein the first electrode has a planar shape selected from a group consisting of: circular, oval, square, rectangular, trapezoidal, and an irregular polygon.

18. The packaged system of claim 10, wherein the circuitry includes a digital phase locked loop coupled to an output of the MEMS resonator to receive a resonate signal form the MEMS resonator.

19. The packaged system of claim 10, wherein the circuitry includes a processor coupled to receive a clock signal referenced to the MEMS resonator.

20. The packaged system of claim 10 including mold compound that encapsulates the MEMS resonator.

* * * * *